United States Patent [19]
Krishnamurthy et al.

[11] Patent Number: 6,137,319
[45] Date of Patent: Oct. 24, 2000

[54] REFERENCE-FREE SINGLE ENDED CLOCKED SENSE AMPLIFIER CIRCUIT

[75] Inventors: Ram K. Krishnamurthy, Beaverton, Oreg.; Atila Alvandpour, Linkoping, Sweden; Reed D. Spotten, Hillsboro, Oreg.

[73] Assignee: Intel Corporation, Santa Clara, Calif.

[21] Appl. No.: 09/302,677

[22] Filed: Apr. 30, 1999

[51] Int. Cl.$^7$ .................................................. H03F 3/45
[52] U.S. Cl. ................. 327/51; 327/55; 327/57; 330/261
[58] Field of Search ..................... 327/51, 55, 57, 327/287, 288, 202, 203, 229; 330/252, 253, 260, 261

[56] References Cited

U.S. PATENT DOCUMENTS

| | | | |
|---|---|---|---|
| 4,616,148 | 10/1986 | Ochii et al. | 365/205 |
| 4,885,479 | 12/1989 | Oritani | 326/25 |
| 5,034,623 | 7/1991 | McAdams | 327/74 |
| 5,086,427 | 2/1992 | Whittaker et al. | 370/462 |
| 5,461,338 | 10/1995 | Hirayama et al. | 327/534 |
| 5,483,181 | 1/1996 | D'Souza | 326/98 |
| 5,559,461 | 9/1996 | Yamashina et al. | 327/305 |
| 5,568,062 | 10/1996 | Kaplinsky | 326/27 |
| 5,594,361 | 1/1997 | Campbell | 326/24 |
| 5,644,255 | 7/1997 | Taylor | 326/81 |
| 5,814,899 | 9/1998 | Okumura | 327/530 |
| 5,852,373 | 12/1998 | Chu et al. | 326/98 |
| 5,892,372 | 4/1999 | Ciraula et al. | 326/96 |
| 5,986,473 | 11/1999 | Krishnamurthy et al. | 326/83 |
| 5,994,918 | 11/1999 | Mehra | 326/30 |
| 6,002,292 | 12/1999 | Allen et al. | 327/379 |

OTHER PUBLICATIONS

P. Larsson et al., "Noise in Digital Dynamic CMOS Circuits," IEE Journal of Solid–State Circuits, vol. 29, No. 6, Jun. 1994, pp. 655–662.

K. Shepard et al., "Noise in Deep Submicron Digital Design," ICCAD '96, pp. 524–531, 1996.

S. Shigematsu et al., "A 1–V High–Speed MTCMOS Circuit Scheme for Power–Down Application Circuits," IEEE Journal of Solid–State Circuits, vol. 32, No. 6, Jun. 1997, pp. 861–869.

Z. Wang et al., "Fast Adders Using Enhanced Multiple–Output Domino Logic," IEEE Journal of Solid–State Circuits, vol. 32, No. 2, Feb. 1997, pp. 206–214.

Y. Nakagome et al., Sub–1–V Swing Internal Bus Architecture for Future Low–Power ULSI's IEEE Journal of Solid–State Circuits, vol. 28, No. 4, Apr. 1993, pp. 414–419.

H. Zhang et al., "Low–Swing Interconnect Interface Circuits," Proceedings of Int'l Symp. On Low Power Electronics and Design, Aug. 10, 1998, pp. 161–166.

N. Weste et al., "Principles of CMOS VLSI Design" (Addison–Wesley 2nd Edition, 1993). pp. 308–311.

T. Sakurai et al., "Low–Power CMOS Design through Vth Control and Low–Swing Circuits" Proceedings of Int'l Symp. On Low Power Electronics and Design, Aug. 18, 1997, pp. 1–6.

*Primary Examiner*—Timothy P. Callahan
*Assistant Examiner*—An T. Luu
*Attorney, Agent, or Firm*—Alan K. Aldous

[57] ABSTRACT

In some embodiments, the invention includes a reference-free single ended sense amplifier. The sense amplifier includes first and second transistors in a differential pair, the first transistor having a control terminal connected to an input conductor to receive an intermediate signal, the first transistor having a data terminal connected to a node, and the second transistor having a control terminal coupled to the node. The sense amplifier further includes a cross-coupled inverter latch having a first inverter coupled to the first transistor through the node and a second inverter coupled to the second transistor. In some embodiments, the control terminal of the second transistor is tied to the node. The first and second transistors of the differential pair may be pFET transistors or nFET transistors or a combination of them. In some embodiments, the sense amplifier is includes as a part of a domino logic gate. Other embodiments are described and claimed.

27 Claims, 7 Drawing Sheets

REFERENCE-FREE SINGLE ENDED CLOCKED SENSE AMPLIFIER CIRCUIT

BACKGROUND OF THE INVENTION

1. Technical Field of the Invention

The present invention relates to circuits and more particularly, to a reference-free single ended clocked sense amplifier circuit, which in some embodiments is used in connection with a domino logic circuit.

2. Background Art

Domino circuits often require true and complementary data input signals to implement Boolean logic functions. While an inversion of the previous domino stage's output may suffice logically, it leads to functional race conditions. Specifically, a domino gate typically requires both its true and complementary inputs to have the same state (e.g., a logic low state) during a precharge phase. This requirement is violated if a simple inverter is placed at the output of the domino stage. To solve this problem, a fully dual-rail implementation (including true and complementary versions of the domino stage) is used.

Figure 1:
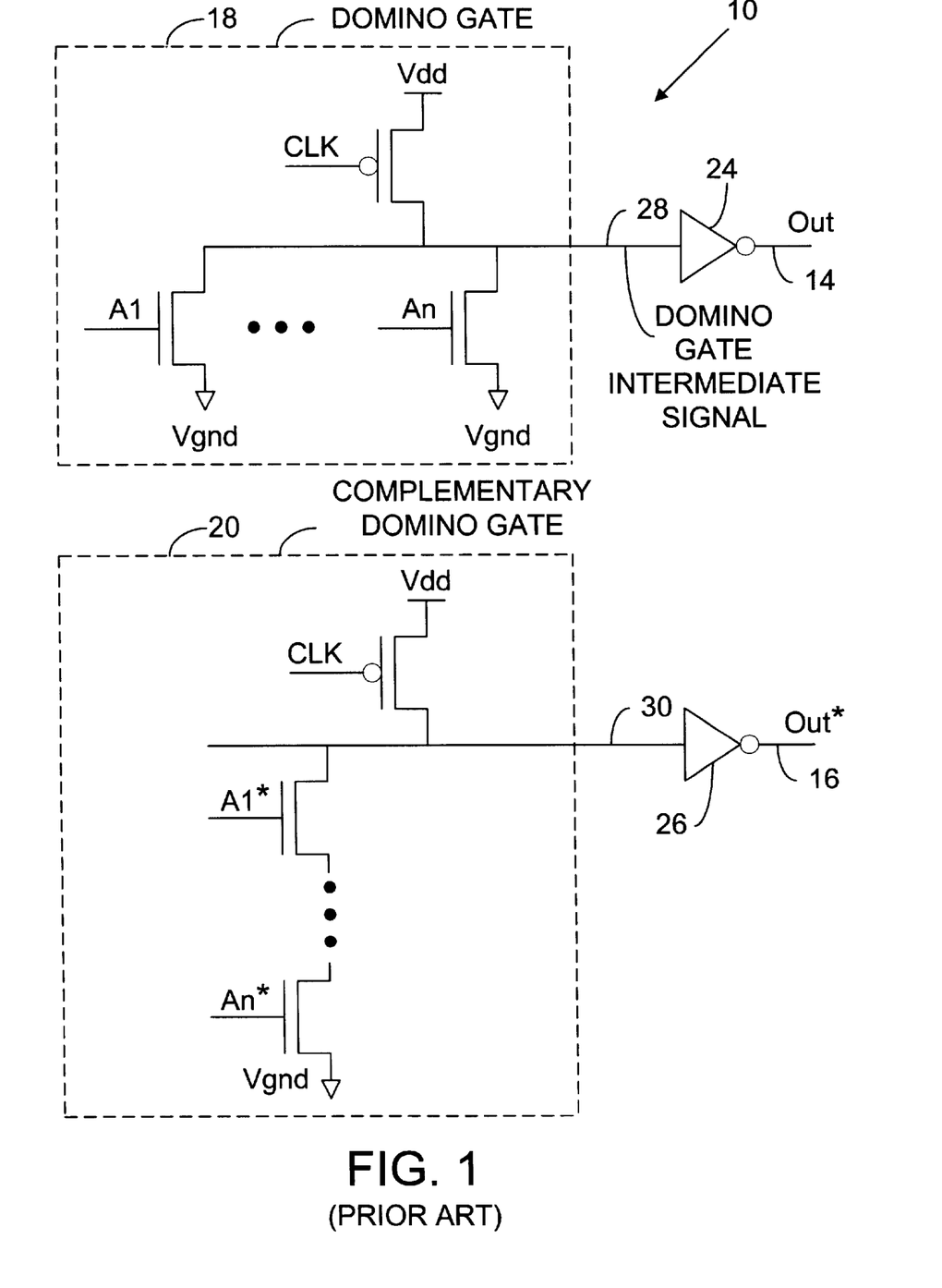
FIG. 1 is a schematic block diagram representation of a prior art domino logic circuit including a domino stage and inverter and a complementary domino stage and inverter to produce Out and Out* signals.

For example, referring to FIG. 1, a prior art domino logic circuit 10 provides signals Out and Out* on conductors 14 and 16 as a function of an input signal A1 . . . An, where Out and Out* both have a logic low state during a precharge phase and are complementary during an evaluate phase. Out and/or Out* may be inputs to a next domino stage(s). Circuit 10 includes a true domino stage 18 and a complementary domino stage 20 (also called domino gates) and static stages 24 and 26. In the particular prior art embodiment illustrated, static stages 24 and 26 are inverters. In this disclosure, signals on conductors 28 and 30 are called domino stage intermediate signals (or INT). They are referred to as intermediate because they are not ready for the next domino stage because they have a logic high state rather than a logic low state in the precharge phase. Inverters 24 and 26 provide signals Out and Out* on conductors 14 and 16, respectively. In the example of circuit 10, the function of domino stage 18 is a NOR function, the result of which is inverted by inverter 24 to produce an OR function (i.e., where OUT is the logical OR of inputs A1 . . . An). The function of domino stage 20 is an OR function, the result of which is inverted by inverter 26 to produce a NOR function (i.e., OUT* is the complement of the logical OR of inputs A1 . . . An).

A disadvantage of circuit 10 is that it requires both a domino stage and a complementary domino stage, leading to approximately twice the area and power consumption.

Another potential disadvantage of circuit 10 is that complementary domino stage 20 includes stacked transistors which can cause significant delay in switching states. It is often the case that in the evaluation phase, one domino gate (e.g., the true gate) can change states significantly faster than the other gate (e.g., the complementary gate).

Figure 2:
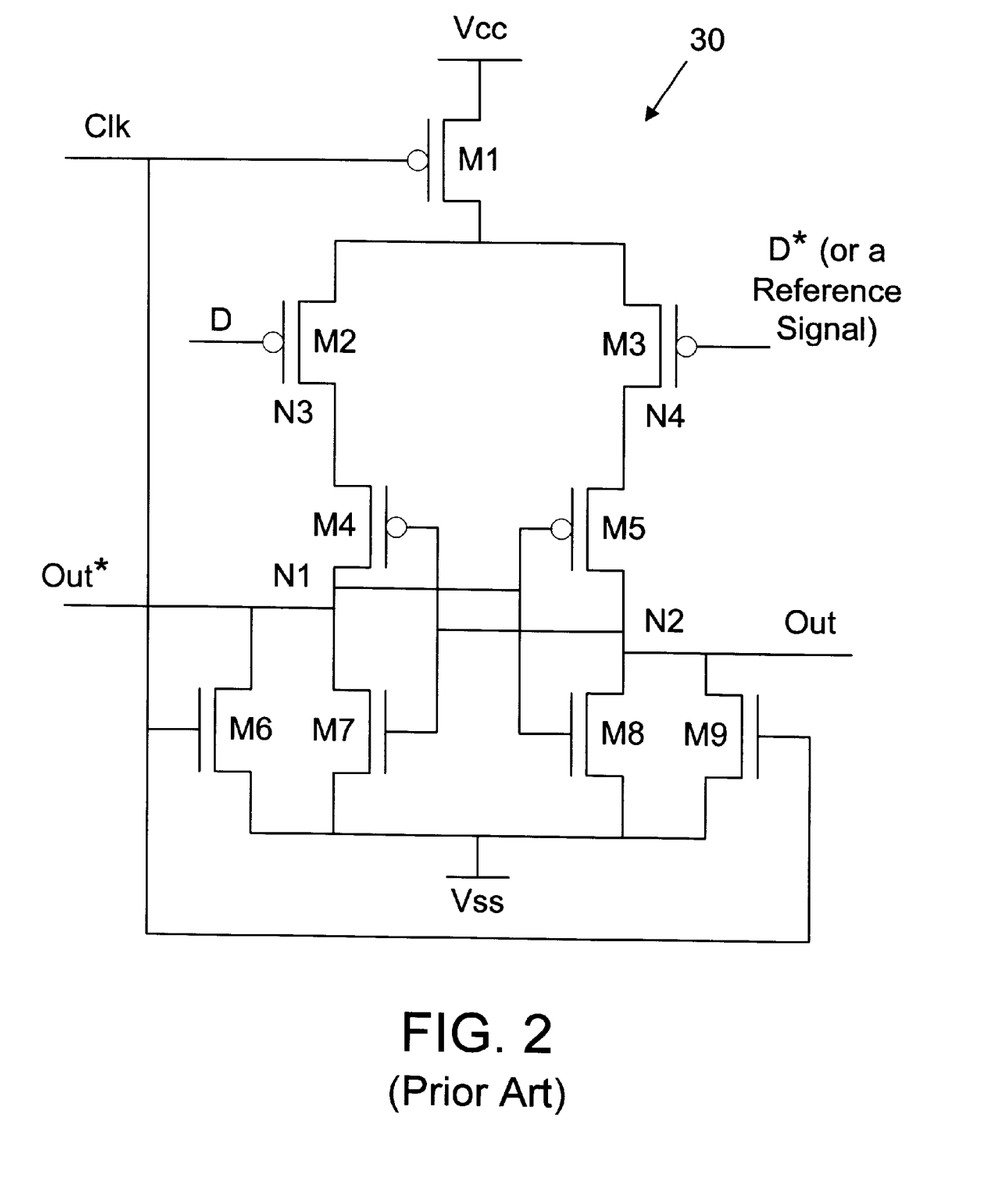
FIG. 2 is a schematic block diagram representation of a prior art sense amplifier.

Now considering circuits from a different technology (e.g., memory technology), prior art sense amplifier 30 has two input signals and two output signals. The voltages of the output signals are indicative of voltages of the input signals. In some versions of sense amplifier 30, the inputs are a D input signal and a D* input signal, wherein in a precharge phase, D and D* have the same voltage and in an evaluate phase, D and D* may have a different voltage. In other versions of sense amplifier 30, one of the input signals (e.g., the input signal to the gate of transistor M2) is variable and the other signal (e.g., the input signal to the gate of transistor M3) is a reference signal (e.g., Vcc/2). In FIG. 2, Out* is at node N1 and Out is at node N2. However, depending on the circuit in which sense amplifier 30 is implemented, either node N1 or N2 may be Out and the other Out*.

The case in which the inputs are D and D* is considered first. Sense amplifier 30 includes p-channel field effect transistors (pFET transistors) M1, M2, M3, M4, and M5, and n-channel field effect transistors (nFET transistors) M6, M7, M8, and M9. Transistors M4, M7, M5 and M8 form a latch of cross-coupled inverters. The pFET and nFET transistors described herein may be metal oxide semiconductor (MOS) pFET and nFET transistors, or other types of FETs or other types of transistors (e.g., bi-polar). If during a precharge phase, the input signals D and D* and a clock signal (Clk) have a logic high voltage ("are high"), then nodes N1 and N2 and corresponding output signals Out* and Out are low (predischarged) through transistors M6 and M9. With clock high, transistor M1 is off. With nodes N1 and N2 low, transistors M7 and M8 are off. However, transistors M4 and M5 may be on and nodes N3 and N4 are pulled down (but not completely to Vss because pFET transistors are involved). However, current does not flow through transistors M4 and M5 because transistors M1, M2, and M3 are off. Transistor M1 is referred to as a clocked head current source transistor. Transistors M2 and M3 together are referred to as differential pair transistors. Transistors M4, M7, M5, and M8 form a cross-coupled inverter latch. Transistors M6 and M9 are predischarge transistors.

If during an evaluate phase, clock goes low, transistor M1 turns on and transistors M6 and M9 turn off. First, assume that input signal D goes low, while D* remains high. In that case, transistor M2 is turned on, while transistor M3 remains off. Nodes N1 and N3 will be pulled high. As node N1 rises, transistor M5 starts to turn off and transistor M8 starts to turn on. As transistor M8 starts to turn on, output signal Out is pinned low keeping transistor M4 on so that node N1 and the signal Out* can continue to be pulled high. This positive feedback loop provides hysteresis, which helps improve DC noise immunity. Second, assume that input signal D* goes low, while D remains high. In that case, transistor M3 is turned on, while transistor M2 remains off. Nodes N2 and N4 will be pulled high. As node N2 rises, transistor M4 starts to turn off and transistor M7 starts to turn on. As transistor M7 starts to turn on, output signal Out* is pinned low keeping transistor M5 on so that node N2 and the signal Out are pulled high.

In those versions with a reference voltage, if D is high, transistor M2 is off, but M3 is at least partially turned on and Out is pulled high. If D is low, more current flows through M2 than M3 and N1 is pulled up more than node N2 turning off M5 and turning on M8 to pull down Out.

Figure 3:
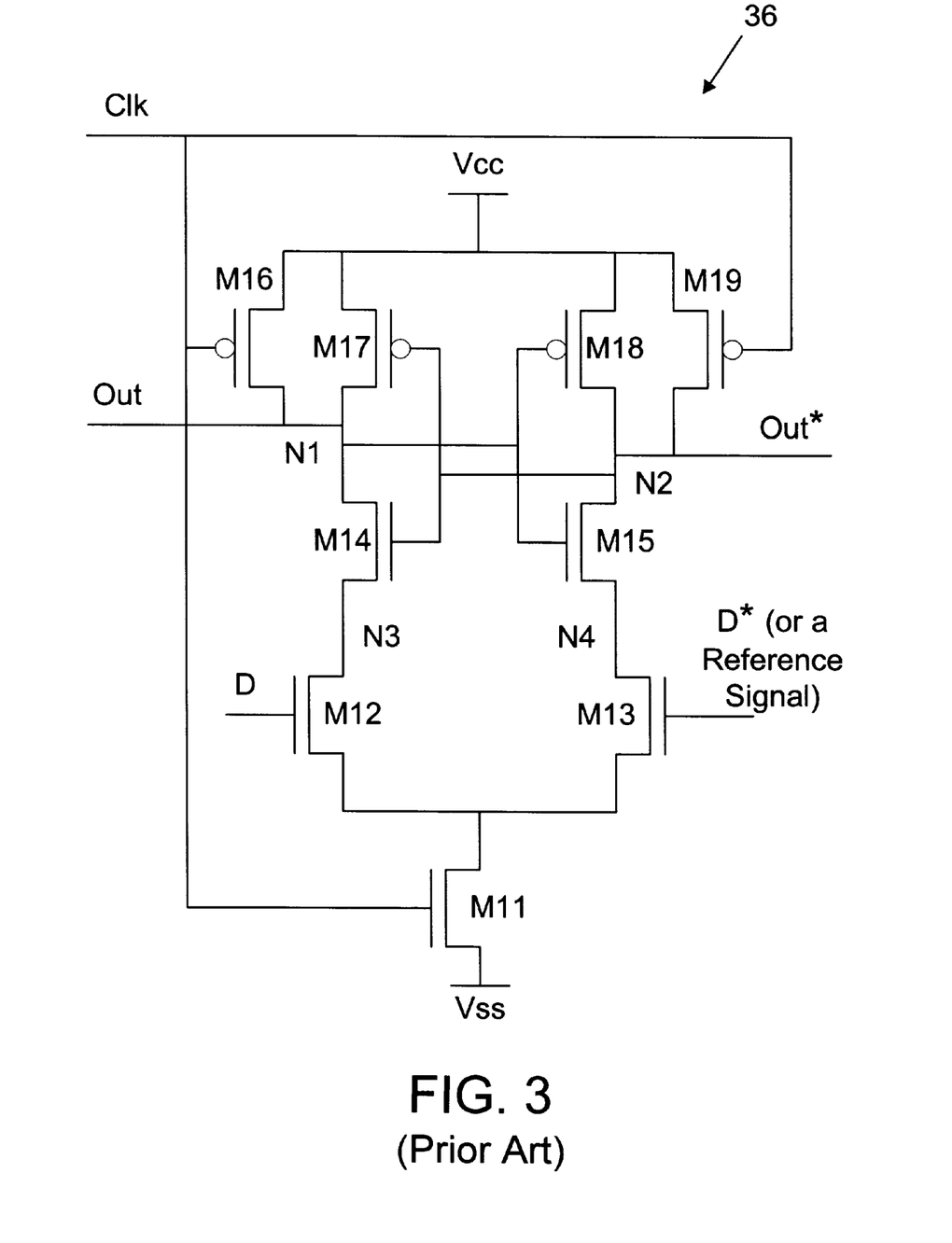
FIG. 3 is a schematic block diagram representation of a prior art sense amplifier.

Referring to FIG. 3, in a different prior art sense amplifier 36, nFET transistors replace pFET transistors and vice versa as compared to sense amplifier 30. Sense amplifier 36 includes a clocked tail current source transistor (M11), and differential pair transistors (M12 and M13) a cross-coupled inverters latch (M14, M17, M15, and M18), and precharge transistors (M16 and M19). Like with sense amplifier 30 of FIG. 2, in some versions of sense amplifier 36, the inputs to the gates of M12 and M13 are a D input signal and a D* input signal. In these versions, during precharge, Clk, D, and D* are low so Out and Out* and nodes N1, N2, N3, and N3 are pulled high. During the evaluate phase, Clk goes low and D and D* are differential. If D goes high, M12 is turned on pulling Out low. If D* goes high, M13 is turned on pulling Out* low.

In other versions of sense amplifier 36, one of the input signals is variable (e.g., to M12) and the other signal is a reference signal (e.g., Vcc/2) (e.g., to M13). The input signal is low during precharge and conditionally changes during an evaluate phase. In the evaluate phase, if D is less than the reference, Out* is pulled low. If D is greater than the reference Out is pulled low.

SUMMARY OF THE INVENTION

In some embodiments, the invention includes a reference-free single ended sense amplifier. The sense amplifier includes first and second transistors in a differential pair, the first transistor having a control terminal connected to an input conductor to receive an intermediate signal, the first transistor having a data terminal connected to a node, and the second transistor having a control terminal coupled to the node. The sense amplifier further includes a cross-coupled inverter latch having a first inverter coupled to the first transistor through the node and a second inverter coupled to the second transistor.

In some embodiments, the control terminal of the second transistor is tied to the node. The first and second transistors of the differential pair may be pFET transistors or nFET transistors or a combination of them.

In some embodiments, the sense amplifier is includes as a part of a domino logic gate.

Other embodiments are described and claimed.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 4:
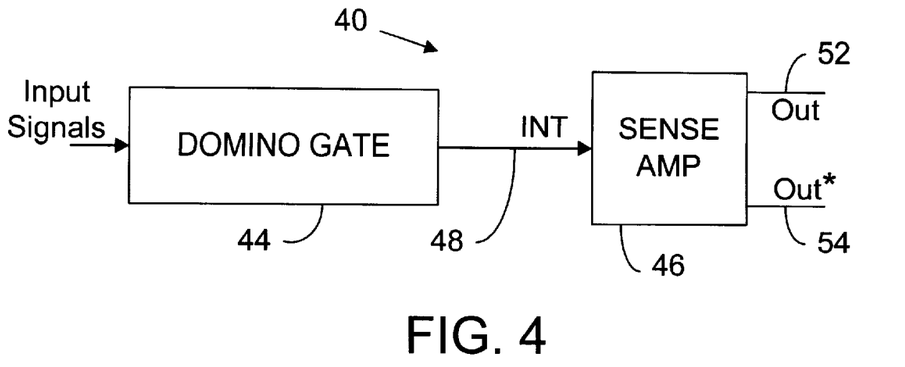
FIG. 4 is a schematic block diagram representation of a domino logic circuit including a domino gate coupled to a single ended sense amplifier circuit, according to some embodiments of the present invention.

Referring to FIG. 4, a domino circuit 40 includes a domino gate 44 (which is an example of a domino stage) and a reference-free single ended sense amplifier 46 (which is an example of a static stage). A domino gate intermediate signal (INT) is provided on input conductor 48 to sense amplifier 46. Sense amplifier 46 is referred to as "reference-free single ended" in that the sense amplifier has only one input (D or D*), without a reference at the other input, which receives the domino gate intermediate signal, in contrast to the prior art sense amplifiers described above. Out and Out* signals are provided on conductors 52 and 54, where in some embodiments, the Out and Out* signals are low during a precharge phase and complementary during an evaluation phase. The voltages of the Out and Out* signals during the evaluation phase depends on the voltage of the intermediate signal (either low or full swing), which in turn is dependent on the input signals to domino gate 44.

Accordingly, domino circuit 40 is advantageous over the prior art domino circuit 10 of FIG. 1 because only a single domino gate is needed in circuit 40, whereas true and complementary domino gates are used in circuit 10. However, both circuits 10 and 40 correctly provide the Out and Out* signals. In the prior art, it was often the case that one of the gates (true or complementary) may require more time to produce an intermediate signal during the evaluate phase. For example, in FIG. 1, complementary domino gate 20 may require more time to evaluate because of the slower stacked transistors. The timing of the phases may accommodate the worst case. Where there is a substantial difference in the time for evaluation of the true and complementary domino gates, there can be substantially time savings by using only the faster of the two. The present invention allows this through the counter-intuitive and nonobvious use of a sense amplifier in a domino logic circuit.

Figure 5:
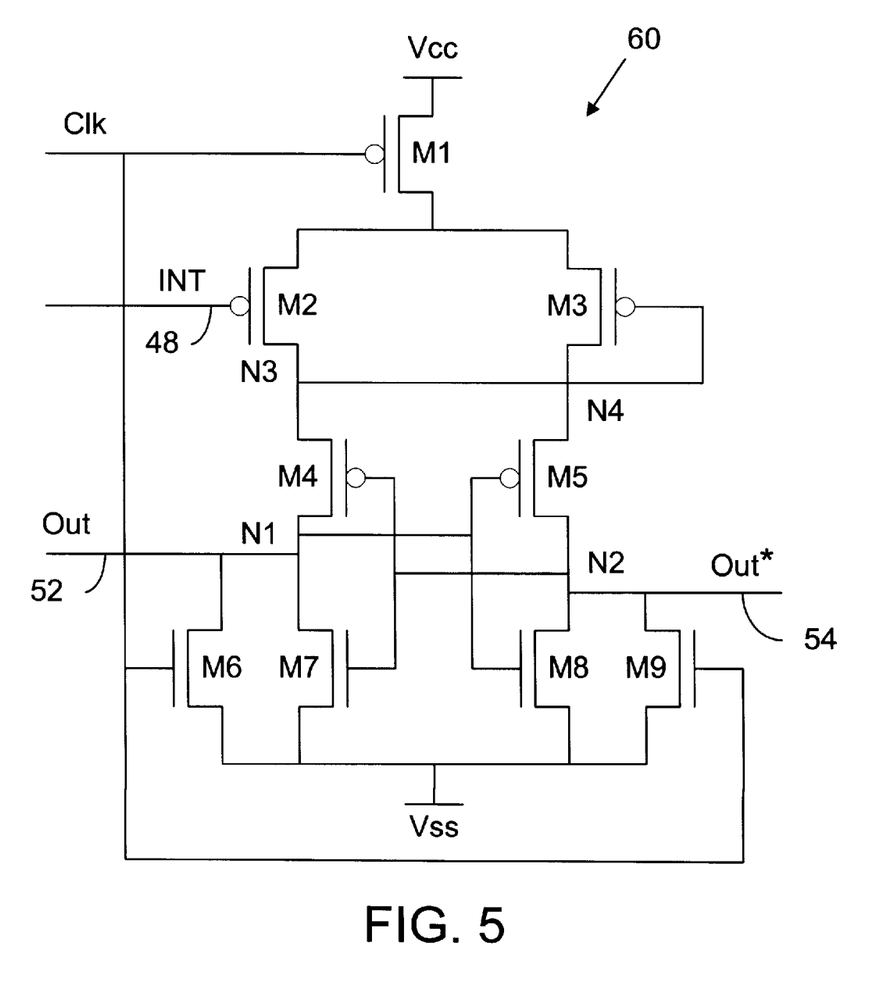
FIG. 5 is a schematic block diagram representation of a reference-free single ended clocked sense amplifier circuit according to some embodiments of the invention.
Figure 6:
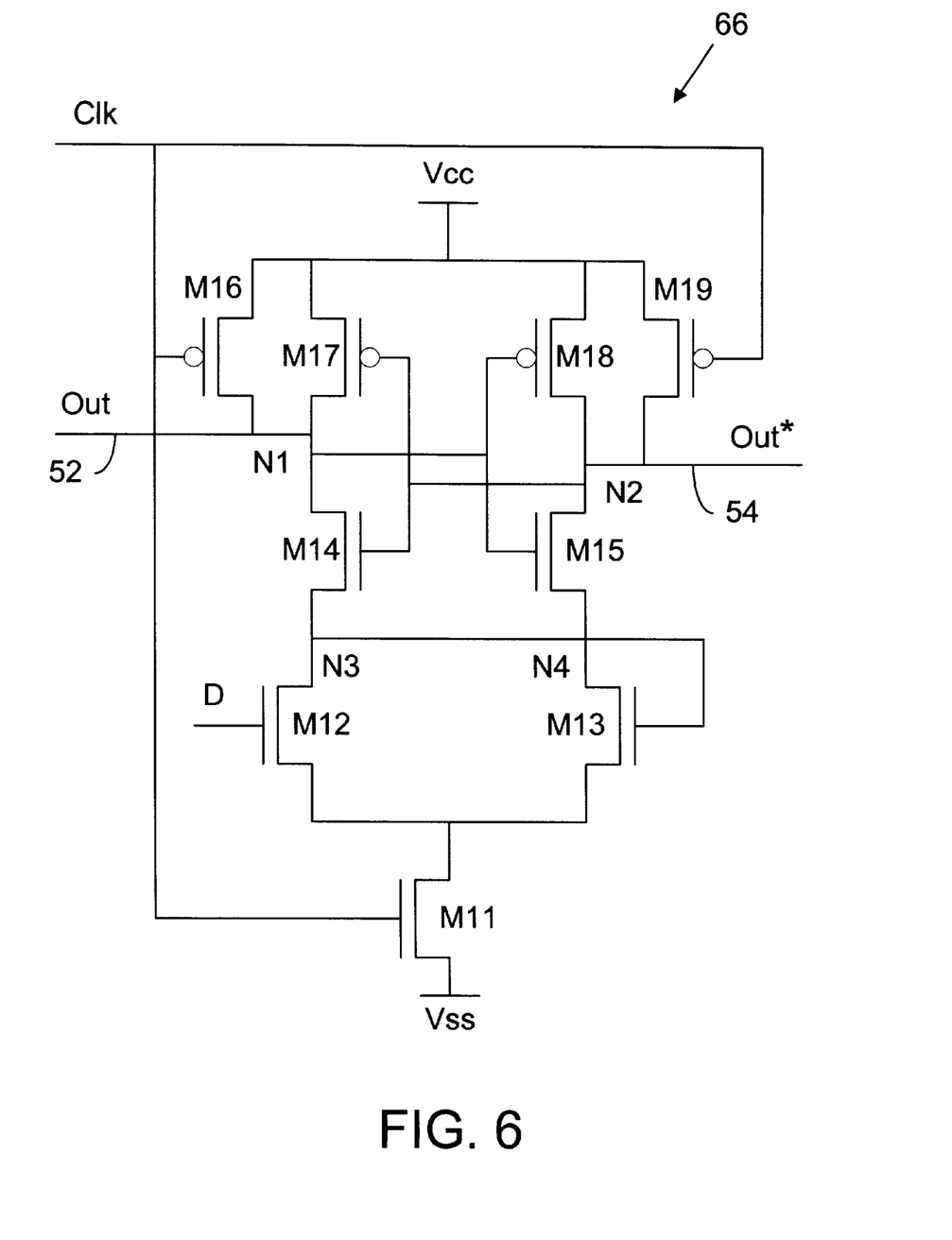
FIG. 6 is a schematic block diagram representation of a reference-free single ended clocked sense amplifier circuit according to some embodiments of the invention.

Examples of sense amplifier 46 are provided in FIGS. 5 and 6. Referring to FIG. 5, a reference-free single ended clocked sense amplifier circuit 60 is similar to sense amplifier circuit 30 in the prior art FIG. 2, except that the gate of pFET transistor M3 is tied (or otherwise coupled) to node N3. However, the invention is not restricted to the details of FIG. 5 or other circuits expressly described herein. Sense amplifiers 30 and 60 are also referred to as current latch sense amplifiers. As used herein, the gate of a FET is referred to as a control terminal and the drain and the source are referred to as data terminals. Transistors M2 and M3 are in a differential pair. Accordingly, in some embodiments, the invention involves a reference-free single ended sense amplifier in which the control terminal of a first transistor of a differential pair receives the input signal, while the control terminal of a second transistor of the differential pair is tied (or otherwise coupled) to a data terminal (or a node connected thereto) of the first transistor. Transistor M1 is referred to as a clocked head current source device, transistors M6 and M9 are referred to as predischarge devices, and transistors M4, M7, M5, and M9 form a cross-coupled inverter latch. Although sense amplifier 60 is described in connection with domino logic circuit 40, it is not so restricted. The intermediate signal can come from some other circuit.

Figure 9:
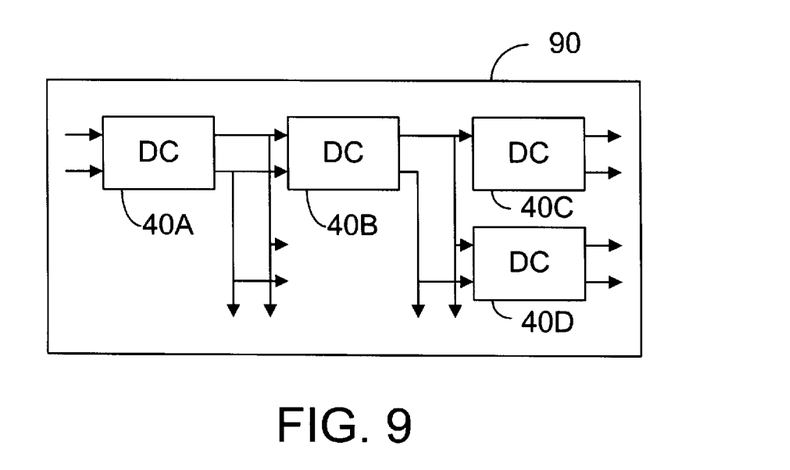
FIG. 9 is a schematic block diagram representation of a die having multiple domino circuits, according to some embodiments.

Referring to FIG. 5, in some embodiments, during a precharge phase, the intermediate signal (INT) at the gate of transistor M2 and the clock signal (Clk) are each high. Both Out and Out* on conductors 52 and 54 are predischarged when INT is high and hence they can be fed into the next domino stage (as shown in FIG. 9). More specifically, with Clk high, transistor M1 is off and transistors M6 and M9 are on, so that nodes N1 and N2 and corresponding signals Out and Out* are pulled low. With nodes N1 and N2 low, transistors M7 and M8 are off and transistors M4 and M5 may be on so that nodes N3 and N4 are pulled down. With intermediate signal INT high, transistor M2 is off, but with node N3 low, transistor M3 is poised to turn on. However, since transistor M1 is off, no current (other than leakage current) passes through transistor M3.

During the evaluate phase, a positive feedback inverter loop is enabled by the cross-coupled inverter latch, causing Out and Out* to attain their new state. Thus, conditionally one of the outputs goes high triggering the evaluate devices of the next domino stage. More specifically, during an evaluate phase, the clock signal briefly transitions low and the intermediate signal INT may remain high or transition low (i.e., conditionally goes low), depending on the inputs to the domino gate. With the clock signal low, transistor M1 turns on and transistors M6 and M9 turn off. First, assume that the intermediate signal INT remains high. In that case, transistor M2 remains off and all current from transistor M1 passes through transistor M3. Nodes N4 and N2 begin to be pulled high. As node N2 (and signal Out*) is pulled high, transistor M4 begins to turn off and transistor M7 begins to turn on. As transistor M7 turns on, node N1 is pinned low keeping transistor M5 on and transistor M8 off, which further allows node N2 (and the signal Out*) to be pulled high. This positive feedback loop gain provides hysteresis, which helps improve DC noise immunity. Node N3 remains low, keeping transistor M3 on. In summary, if the intermediate signal INT remains high, the signal Out is low and signal Out* is high. This result is the same as in prior art circuit 10 of FIG. 1, however, only one domino gate (e.g., the true domino gate), rather than both true and complementary domino gates, is needed. (This example assumes domino gate 44 in FIG. 4 is the true gate like domino gate 18 in FIG. 1. As explained below, depending on the circumstances, the Out and Out* signals might be switched.) Even though sense amplifier 60 may take more time to switch than inverters 24 and 26 of prior art circuit 10 in FIG. 1, the elimination of the slower domino gate allows the overall domino circuit 40 to operate faster than prior art circuit 10.

Next, assume that the intermediate signal INT transitions low during the evaluate phase. In that case, transistor M2 is turned on and current from transistor M1 is split between transistors M2 and M3. As transistor M2 is turned on, nodes N3 and N1 begin to go high. As node N3 goes high, transistor M3 is turned off. In addition, as node N1 goes high, transistor M5 is turned off and transistor M8 is turned on, keeping node N2 (and signal Out*) pinned low, which keeps transistor M4 on and transistor M7 off, which allows node N1 (and the signal Out) to be pulled high. This positive feedback loop gain provides hysteresis, which helps improve DC noise immunity. In summary, if the intermediate signal INT goes low, the signal Out* stays low and signal Out goes high. This result is the same as in prior art circuit 10 of FIG. 1, however, only one domino gate (e.g., the true domino gate), rather than both true and complementary domino gates, is needed. Again, even though sense amplifier 60 may take more time to switch than inverters 24 and 26 of prior art circuit 10 in FIG. 1, the elimination of the slower domino gate allows the overall domino circuit 40 to operate faster than prior art circuit 10.

FIG. 6 illustrates reference-free single ended sense amplifier 66 according to some embodiments of the present invention. It is another example of sense amplifier 46 in FIG. 4. As compared to sense amplifier 60, nFET transistors are replaced with pFET transistors and vice-versa. Sense amplifier 66 includes a clocked tail current source transistor (M11), and differential pair transistors (M12 and M13) a cross-coupled inverters latch (M14, M17, M15, and M18), and precharge transistors (M16 and M19). The control terminal (gate) of M13 is tied (or otherwise coupled) to a data terminal (drain) of M12 (or a node connected thereto). During a precharge phase, Clk and intermediate signal Int are low. Accordingly, M16 and M19 are on, pulling up nodes N1 and N2 and corresponding signals Out and Out*. With Out and Out* high, M14 and M15 are on, pulling up nodes N3 and N4.

During an evaluate phase, Clk goes high and Int conditionally goes high. With Clk high, M16 and M19 are turned off and M11 turns on. With Out and Out* high, transistors M14 and M15 are on or poised to turn on. If Int stays low, M12 does turn on, but with node N3 high, transistor M13 turns on, pulling nodes N2 and N4 and corresponding signal Out* low. With Out* low, M14 is off and M17 is on, pinning Out high, which keeps M18 off and M15 on. This positive feedback loop gain provides hysteresis, which helps improve DC noise immunity. If Int goes high, M12 is turned on pulling nodes N1 and N3 and corresponding signal Out low. With node N3 low, M13 is either prevented from being turned on or is quickly turned off. With Out low, M15 is off and M18 is on pinning Out* high, which keeps M17 off and M14 on. This positive feedback loop gain provides hysteresis, which helps improve DC noise immunity. Even though sense amplifier 66 may take more time to switch than inverters 24 and 26 of prior art circuit 10 in FIG. 1, the elimination of the slower domino gate allows the overall domino circuit 40 to operate faster than prior art circuit 10.

Figure 7:
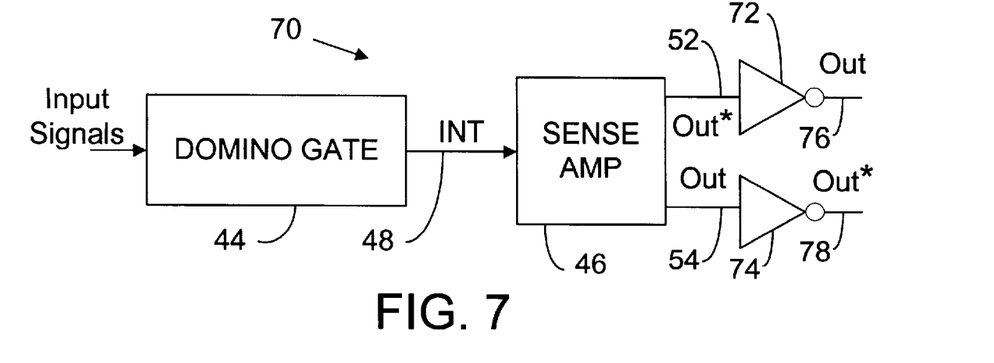
FIG. 7 is a schematic block diagram representation of a domino logic circuit including a domino gate coupled to a single ended sense amplifier circuit, with inverters at the outputs of the sense amplifier, according to some embodiments of the present invention.

In order to keep the speed of sense amplifier circuit 60 high, the size of transistors M1–M9 may be made small. In that case, they might not have the drive power to adequately drive the next domino logic circuit. One solution is described in connection with a domino logic circuit 70 in FIG. 7. Referring to FIG. 7, inverters 72 and 74 are positioned between conductors 52 and 54 (nodes N1 and N2), respectively, of sense amplifier circuit 46 and conductors 76 and 78, which in the example carry the Out and Out* signals, respectively. Accordingly, the transistors of sense amplifier 46 can be sized for speed, and inverters 72 and 74 can provide drive power for inputs of the next domino logic circuit(s) (shown in FIG. 9). Note that even with a sense amplifier and inverters 72 and 74, domino logic circuit 70 can be faster than the prior art domino logic circuit 10 in FIG. 1, in the case in which one of the domino stage gates is relatively slow.

In comparing FIGS. 4 and 7, it can be seen that in domino logic circuit 40, conductors 52 and 54 carry the Out and Out* signals, respectively, whereas in domino logic circuit 70, conductors 52 and 54 carry the Out* and Out signals, respectively. It is arbitrary whether an output signal is considered Out or Out*. However, the correct conductor is coupled to the inputs of the next domino logic circuit(s). Another way to switch whether conductor 52 or 54 carries the Out versus the Out* signal is to switch which transistor receives the INT signal. For example, if sense amplifier circuit 60 in FIG. 5 is modified so that the gate of transistor M3 receives the INT signal and the gate of transistor M2 is tied (or otherwise coupled) to node N4, the states of conductors 52 and 54 in the evaluate phase would be inverted.

In FIGS. 4 and 7, domino gate 44 is a true domino gate, but could be a complementary domino gate. In such a case, the signal INT would be different in evaluate phase and the states of conductors 52 and 54 would also be inverted. This could be taken into consideration in determining which signal is Out and which is Out*. For example, in FIG. 8, domino logic gate 80 includes a domino gate 82, which is the complement of domino gate 44 in FIGS. 4 and 7. In each of the figures, the particular output conductor chosen to be Out or Out* is arbitrary, and the invention is not so restricted. The circuit designer can choose either to be Out or Out*.

Figure 8:
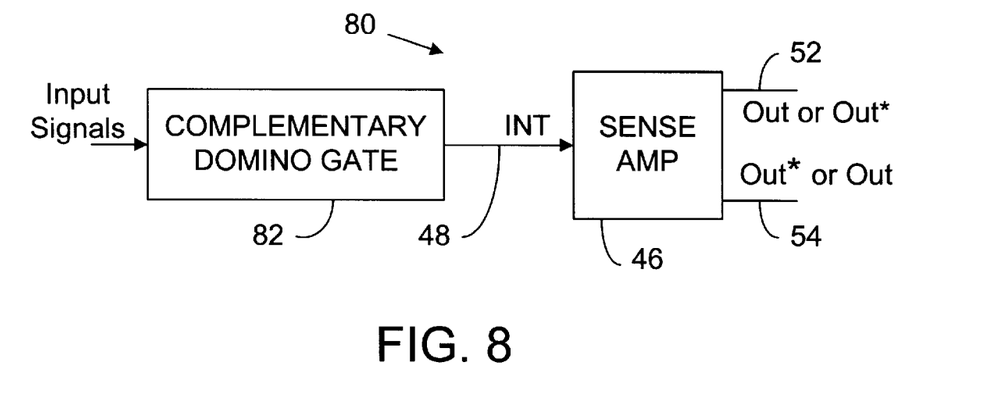
FIG. 8 is a schematic block diagram representation of a domino logic circuit including a domino gate (which is the complement of the domino gate of FIG. 3) coupled to a single ended clocked sense amplifier circuit, according to some embodiments of the present invention.

FIG. 8 illustrates a die 90 on which various ones of the domino logic circuits (DC) 40A, 40B, 40C, and 40D (each of which may be like domino logic circuit 40, 70, or 80) are coupled through input signals and output signals Out and/or Out*. Of course, die 90 would include numerous other circuits that are not illustrated. Die 90 could be a die for any of a various types of electrical devices including a microprocessor, DSP (digital signal processor), ASIC (application specific integrated circuit), in connection with register files, chipset, networking, communications including (RF) radio frequency, etc.

Parameter values (e.g., size and threshold voltage Vt) of transistors in FIGS. 6 and 7 can be chosen to achieve certain results, such as noise immunity and speed. One way to choose the parameter values is to start with values that achieve the desired results in the corresponding symmetrical prior art sense amplifier 30 or 36 (e.g., M2=M3, M7=M8, etc.). Then values can be altered until the results are achieved in sense amplifiers 60 and 66, or another sense amplifier according to the present invention. The relative timing of the Clk and Int signals can also be adjusted.

In some embodiments, the time required to invert the Out signal as very close to time required to inverter the Out* signal in the evaluate phase.

Figure 10:
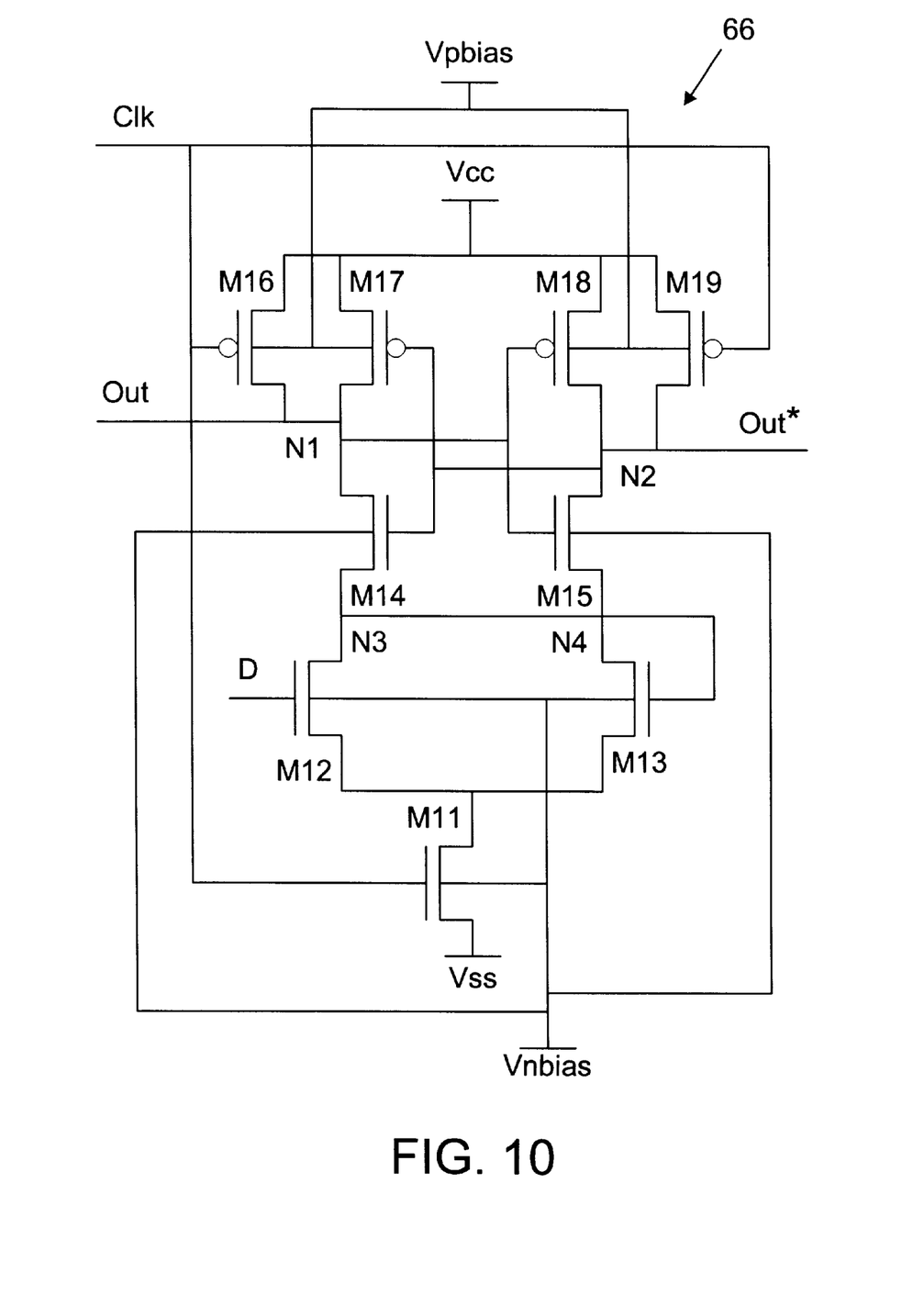
FIG. 10 is a schematic block diagram representation of the sense amplifier of FIG. 6 with bias circuitry, according to some embodiments of the present invention.

The transistors may be forward biased (for performance), zero biased, or reverse biased (for leakage power reduction). FIGS. 5 and 6 may be considered examples of zero bias. Transistors may have different biases at different times and different transistors may have different biases. For example, referring to FIG. 10, the body (or bodies) of the nFET transistors of sense amplifier 66 are coupled to a Vnbias and the body (or bodies) of the pFET transistors are coupled to a Vpbias. Vnbias and/or Vpbias may be constant or change and may cause the nFET and pFET transistors to be forward biased, reverse biased, or zero bias. In some embodiments, Vnbias may be Vcc and Vpbias may be Vss.

The transistors could be enhancement or depletion mode devices. FET (e.g., MOSFET or other FETs) or other types of transistors (e.g., bi-polar) may be used.

The different occurrences of the term "some embodiments" are not necessarily all referring to the same embodiments.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A reference-free single ended sense amplifier, comprising:

first and second transistors in a differential pair, the first transistor having a control terminal connected to an input conductor to receive an intermediate signal, the first transistor having a data terminal connected to a node, and the second transistor having a control terminal coupled to the node; and a cross-coupled inverter latch having a first inverter coupled to the first transistor through the node and a second inverter coupled to the second transistor.

2. The sense amplifier of claim 1, wherein the control terminal of the second transistor is tied to the node.

3. The sense amplifier of claim 1, wherein the first and second transistors of the differential pair are pFET transistors.

4. The sense amplifier of claim 1, wherein the first and second transistors of the differential pair are nFET transistors.

5. The sense amplifier of claim 1, further comprising a clocked head current source transistor coupled to the first and second transistors.

6. The sense amplifier of claim 1, further comprising a clocked tail current source transistor coupled to the first and second transistors.

7. The sense amplifier of claim 1, further comprising first and second output conductors coupled to the first and second inverters, respectively.

8. The sense amplifier of claim 7, further comprising precharge transistors coupled to the first and second output conductors.

9. The sense amplifier of claim 7, further comprising predischarge transistors coupled to the first and second output conductors.

10. The sense amplifier of claim 1, wherein the cross-coupled inverter latch provides hysteresis through a positive feedback loop gain to help improve DC noise immunity.

11. The sense amplifier of claim 1, wherein the first and second transistors are forward biased.

12. A domino logic circuit, comprising:

a domino gate to produce an intermediate signal in response to at least one input signal;

a reference-free single ended sense amplifier coupled to the domino gate to receive the intermediate signal, the sense amplifier including:

(a) first and second transistors in a differential pair, the first transistor having a control terminal connected to an input conductor to receive an intermediate signal, the first transistor having a data terminal connected to a node, and the second transistor having a control terminal coupled to the node; and (b) a cross-coupled inverter latch having a first inverter coupled to the first transistor through the node and a second inverter coupled to the second transistor.

13. The sense amplifier of claim 12, wherein the control terminal of the second transistor is tied to the node.

14. The sense amplifier of claim 12 wherein the first and second transistors of the differential pair are pFET transistors.

15. The sense amplifier of claim 12, wherein the first and second transistors of the differential pair are nFET transistors.

16. The sense amplifier of claim 12, further comprising a clocked head current source transistor coupled to the first and second transistors.

17. The sense amplifier of claim 12, further comprising a clocked tail current source transistor coupled to the first and second transistors.

18. The sense amplifier of claim 12, further comprising first and second output conductors coupled to the first and second inverters, respectively.

19. The sense amplifier of claim 18, further comprising precharge transistors coupled to the first and second output conductors.

20. The sense amplifier of claim 18, further comprising predischarge transistors coupled to the first and second output conductors.

21. The sense amplifier of claim 12, wherein the cross-coupled inverter latch provides hysteresis through a positive feedback loop gain to help improve DC noise immunity.

22. The sense amplifier of claim 12, wherein the first and second transistors are forward biased.

23. The sense amplifier of claim 12, wherein the domino gate is faster in an evaluation phase that is its complementary gate.

24. A die comprising:

multiple domino logic circuits each comprising:

(1) a domino gate to produce an intermediate signal in response to at least one input signal; and (2) a reference-free single ended sense amplifier coupled to the domino gate to receive the intermediate signal, the sense amplifier including:

(a) first and second transistors in a differential pair, the first transistor having a control terminal connected to an input conductor to receive an intermediate signal, the first transistor having a data terminal connected to a node, and the second transistor having a control terminal coupled to the node; and (b) a cross-coupled inverter latch having a first inverter coupled to the first transistor through the node and a second inverter coupled to the second transistor.

25. The sense amplifier of claim 24, wherein the control terminal of the second transistor is tied to the node.

26. The sense amplifier of claim 24 wherein the first and second transistors of the differential pair are pFET transistors.

27. The sense amplifier of claim 24, wherein the first and second transistors of the differential pair are nFET transistors.

* * * * *